United States Patent [19]

Kay

[11] 4,010,463

[45] Mar. 1, 1977

[54] PHASE LOCKED LOOP RESOLVER TO DIGITAL CONVERTER

[75] Inventor: Robert M. Kay, Seminole, Fla.

[73] Assignee: The United States of America as represented by the Secretary of the Air Force, Washington, D.C.

[22] Filed: Apr. 21, 1975

[21] Appl. No.: 570,065

[52] U.S. Cl. .......................... 340/347 SY; 318/661
[51] Int. Cl.² ....................................... H03K 13/02
[58] Field of Search ............. 340/347 SY; 318/661, 318/605

[56] References Cited

UNITED STATES PATENTS

| | | | |
|---|---|---|---|
| 3,315,253 | 4/1967 | Geller | 340/347 SY |
| 3,555,542 | 1/1971 | Guiot | 340/347 SY |
| 3,634,838 | 1/1972 | Granqvist | 340/347 SY X |
| 3,676,659 | 7/1972 | Asmussen | 340/347 SY X |
| 3,851,330 | 11/1974 | Huber | 340/347 SY |
| 3,877,024 | 4/1975 | Friday | 340/347 SY |
| 3,878,535 | 4/1975 | Twiss | 340/347 SY |
| 3,898,568 | 8/1975 | Huber | 340/347 SY |

Primary Examiner—Thomas J. Sloyan
Attorney, Agent, or Firm—Joseph E. Rusz; Julien L. Siegel

[57] ABSTRACT

A resolver-to-digital converter where a signal of predetermined frequency is converted to a given waveform sequence by a logic circuit, band passed filtered, and phase splitted into orthogonal components. These components are fed to operational amplifiers and then into the input windings of a resolver. The outputs of the resolver are fed to a pair of zero crossing differential comparators and then to phase detectors, the outputs of which are summed. The sum of the signals is filtered and is used to regulate a voltage controlled oscillator that pulses a synchronous counter that is fed back to the phase detectors forming a phase-locked loop. The synchronous counter feeds a serial register that is strobed by the output of a zero crossing differential amplifier fed by the compensation windings of the resolver.

1 Claim, 5 Drawing Figures

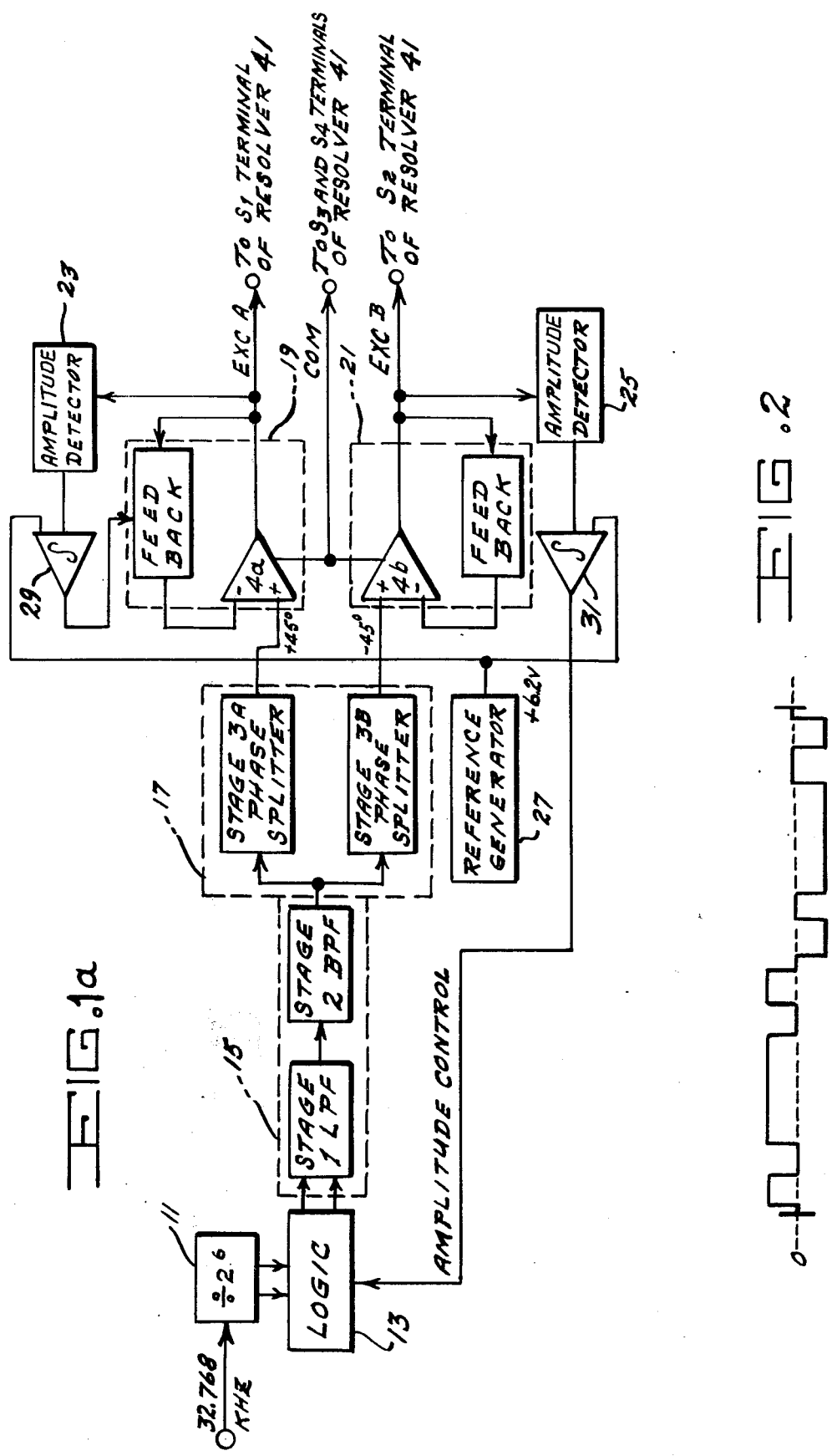

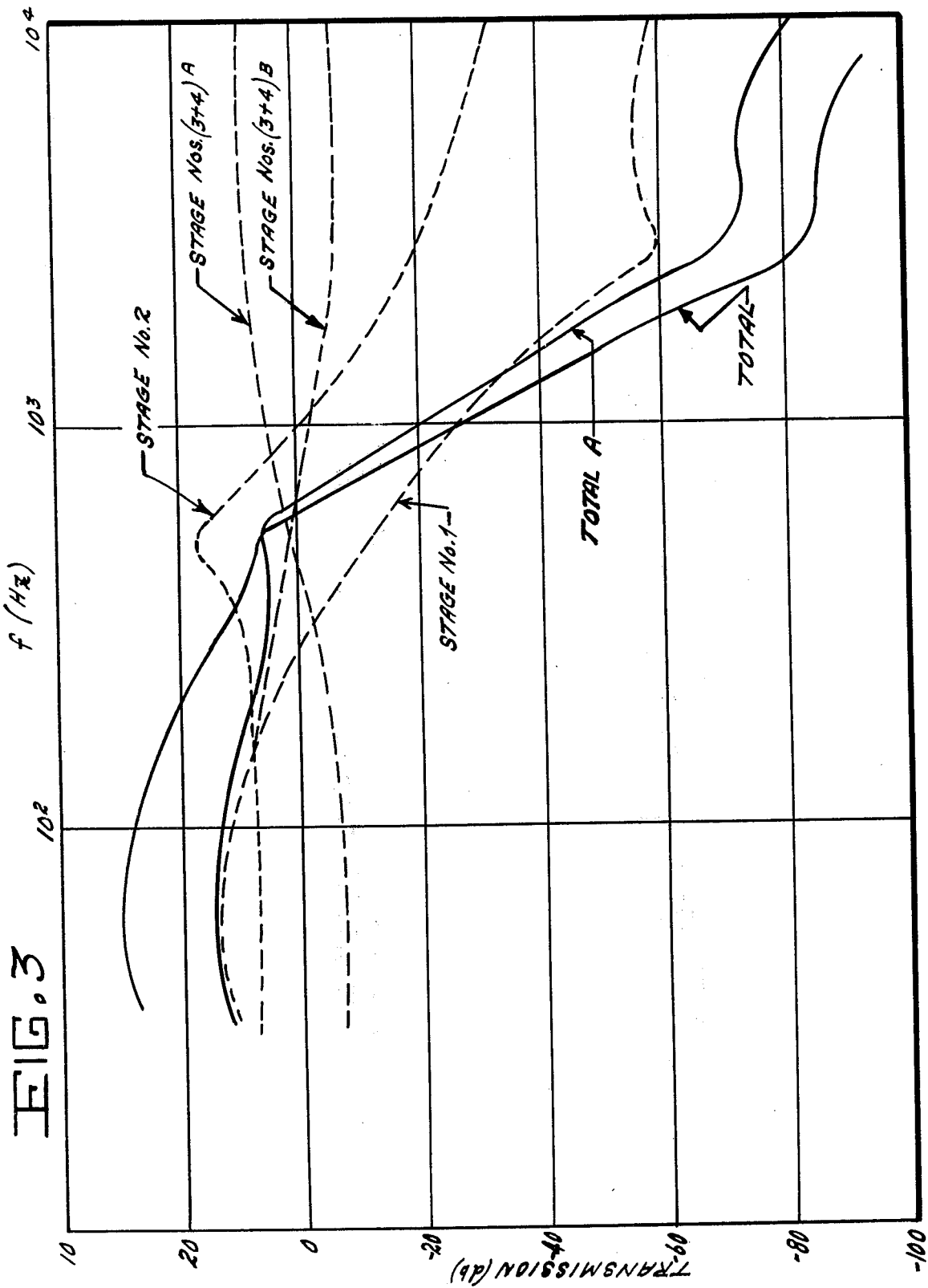

PHASE LOCKED LOOP RESOLVER TO DIGITAL CONVERTER

STATEMENT OF GOVERNMENT INTEREST

The invention described herein may be manufactured and used by or for the Government for governmental purposes without the payment of any royalty thereon.

BACKGROUND OF THE INVENTION

This invention relates to signal conversions, and more particularly to a resolver-to-digital converter using a phase-locked loop.

Conventional resolver-to-digital converters have in general employed some sort of resolver to analog conversion followed by an analog to digital converter. In this invention a technique is presented using a phase-locked loop to provide a conversion from the resolver-to-digital form directly with less error and with significantly fewer components than the conventional method.

The high degree of accuracy is achieved by utilizing two new principles. One is the summing of the demodulated outputs from each of the two resolver output windings. All but one of the first order error terms are thus eliminated leaving only second and a higher order even terms. The second principle eliminates the remaining first order error term, which is the error introduced by the resolver primary phase shift. This is accomplished through the use of compensation windings which are wound in the same resolver excitation stator slots.

The present invention obtains a significant reduction in components, thereby reducing the cost and increasing the reliability; it obtains a conversion accuracy of ± 1 minute of arc, and it uses a single speed rather than a dual speed resolver. The number of components has been reduced by 90 percent.

SUMMARY OF THE INVENTION

If two electrically orthogonal, equal amplitude sinusoids are applied to a mechanically orthogonal resolver excitation windings, a constant amplitude rotating magnetic field is generated within the resolver. The voltage induced at the resolver output windings will therefore have a constant amplitude independent of resolver angle but a phase that is directly related to the resolver angle. Since the two output windings are mechanically 90° apart, the signals that are produced are electrically 90° apart. The phase-locked loop recovers the phase data from the output windings and provides this information directly in digital form, thus avoiding the usual analog to digital converter.

The simplicity achieved, however, is not without a price. To attain even moderate accuracies extremely tight control on the excitation amplitudes orthogonalities must be maintained. The resolver itself is quite critical, and tight control must be maintained during the machining, winding, and assembly of the unit. In addition, the signal phase shift through the resolver primary winding is directly reflected into the output windings. Since this phase shift is very temperature sensitive, a large error will result unless the resolver is either maintained at a constant temperature or temperature compensated in some fashion.

The present invention overcomes the above problems by using two new techniques which provide a high degree of accuracy. The first of these provides a cancelling effect of all first order error terms (excepting the primary phase shift) leaving only second and higher even order terms. Therefore, many of the previous constraints on the excitation and the resolver preciseness can be loosened considerably and the whole scheme becomes more practical.

The second technique totally eliminates the phase shift through the resolver primary as a source of error. A second set of windings, called compensation windings, are wound in the same slots as the stator primary windings. The voltage induced in the compensation windings is a function only of the rotating magnetic field within the resolver. However, it is this same magnetic field that produces the voltage at the rotor output windings. The phase difference between the voltages produced at the output windings and the compensation windings is equal to the mechanical angle between the rotor and stator. We are interested therefore in measuring the electrical phase difference between the voltages produced at these two sets of windings. It is quite apparent that any phase shift through the resolver primary winding is now of no significance.

Ideally, the phase-locked loop remains perfectly aligned to the phase of the resolver output voltage. By sampling the contents of the long counter in the phase-locked loop using the phase of the compensation winding voltage, the desired resolver angle in digital format is obtained.

These two techniques therefore permit the practical implementation of a direct but single angle to digital converter.

It is therefore an object of this invention to provide a novel and improved resolver-to-digital converter having a conversion accuracy of ± 1 minute of arc.

It is another object to provide a resolver-to-digital converter having a reduction of components from those used in the past thereby reducing the cost of increasing the reliability.

It is still another object to provide a resolver-to-digital converter that uses a single speed resolver rather than one with a dual speed.

These and other objects, features and advantages of the invention will become more apparent from the following description taken in conjunction with the illustrative embodiment in the accompanying drawings.

DESCRIPTION OF THE DRAWINGS

FIG. 1 and 1b are schematic diagrams showing an embodiment of the invention;

FIG. 2 is a waveform diagram showing the output of the logic circuit of that shown in FIG. 1a;

FIG. 3 is a graph showing the frequency response of the resolver's excitation circuit.

DETAILED DESCRIPTION OF THE PREFERRED EMBODIMENT

Figure 1B:
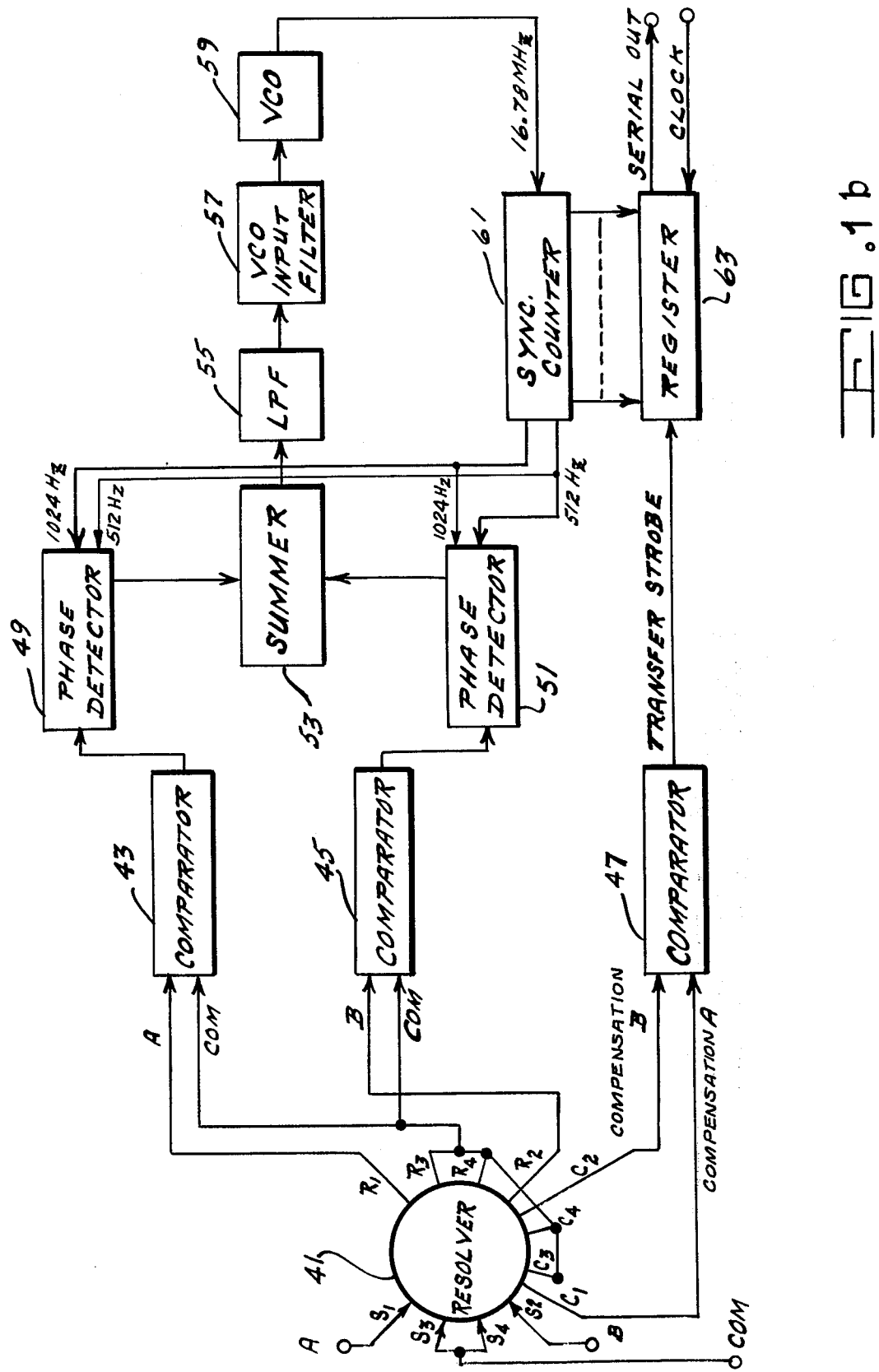

The resolver-to-digital converter has three sections: 1) the resolver excitation; 2) the resolver, and 3) the measurement of electronics, which includes the phase-locked loop. A block diagram of the excitation electronics is shown in FIG. 1a and can be separated into five functions which are: 1) the control and logic; 2) the band pass filter; 3) the phase splitter; 4) the output power amplifier, and 5) the amplitude detector and feedback control.

The input signal, in this example, 32.768 kHz, is applied to counter 11 which divides by $2^6$ producing a signal of 512 Hz. This is fed to logic circuit 13 which can be interconnected flip-flops to produce an output waveform as shown in FIG. 2 and is a standard, readily available circuit component. The waveform shown in FIG. 2, which is drawn to scale, represents a composite of the signals of the two lines fed from logic circuit 13 to filter 15. The period of the sinusoidal output signals is the same as the period represented by the total waveform of FIG. 2, which is 64 times longer than the period of the input clock signal. The total period of the first positive pulse and the zero level which follows is 8 times the input clock period. The first long positive pulse is 14 times the input clock period. This waveform is practically devoid of third harmonic distortion thereby simplifying the design and operation of the following band pass filter.

Filter section 15 is comprised of stage 1, the low pass filter, and stage 2, the band pass filter, and its response, together with the response of the following sections, as shown in the frequency response curves of FIG. 3. The function of the band pass filter is to reduce the odd harmonic distortion at the output to a level of less than 0.02 percent.

Stage 1 accepts the digital push-pull signal from logic circuit 13 and provides a simple three-pole low pass filter function. It can include 3.3 megohm resistors which bypass the input resistors and provide an out-of-phase cancelling type effect for the fifth harmonic. The input resistors together with two input capacitors form a low pass two pole filter. The phase shift for the fifth harmonic is very nearly 180°. Therefore, the 3.3 megohm resistors which bypass the input resistors add an in-phase fifth harmonic component to this phase shifted fifth harmonic. These two fifth harmonics cancel each other out. Input capacitor in stage 1 block the DC level riding on the digital input signals.

Stage 2 provides additional filtering plus some gain at the fundamental frequency. It is a second order underdamped low pass filter with a response defined by the following equations.

$$\omega_n = 1/RC = 1/(14\text{ K})(0.022\mu) = 3247 \text{ rad/sec} = 517 \text{ Hz}$$

$$\zeta = 1 - R_2/2R_1 = 1 - 54.9\text{K}/(2)(34\text{K}) = 0.193$$

$$\omega_p(\text{freq. for max. gain}) = \omega_n \sqrt{1-2\zeta^2} = 3124 \text{ r/s} = 498 \text{ Hz}$$

$$A_n \text{ (gain at } \omega_n) = (R_1 + R_2)/(2R_1 - R_2) = 88.9/13.1 = 6.78$$

$$A_p \text{ (gain at } \omega_p) = A_n/\sqrt{1-\zeta^2} = 6.91$$

Phase splitter 17 is divided into two parts, stage 3a and stage 3b each utilizing standard resistors, capacitors, and integrated circuit operational amplifiers, such as a phase splitter being defined on page 359 or "Modern Dictionary of Electronics", published by the Bobbs-Merrill Company, 1970. Stage 3a provides a leading phase of 45° and stage 3b provides a lagging phase of 45°. The resulting difference is therefore 90°. In this type of phase splitter the phase shift is determined primarily by the resistor ratios. Variations in capacitor value have only a second order effect, thus permitting the generation of accurate phase shifts. Equations defining the characteristics of the phase splitter are shown below.

Stage 3a:

$$R_1/R_2 = 2 \sin \theta/(1 - \sin \theta)$$

$$\theta_a = \tan^{-1} R_1/2R_2 \sqrt{1 + R_1/R_2} = \tan^{-1} 34/(2)(6.98)\sqrt{1+34/6.98}$$

$$\theta_a = \tan^{-1} 1.005 = 54.1$$

$$A_a = \cos \theta/(1 + \sin \theta) = 0.705/1.709 = 0.413$$

Stage 3b:

$$\theta_b = -\tan^{-1} R_1/2R_2 \quad \sqrt{1+R_1/R_2} = -\tan^{-1} 28.7/2(5.9) \sqrt{1+28.7\pi5.9}$$

$$\theta_b = -\tan^{-1} 1.005 = -45.1$$

$$A_a = \cos \theta/(1 + \sin \theta) = 0.705/1.709 = 0.413$$

Adequate power to drive four resolvers is provided by operational amplifiers 19 and 21 which can be the NHOOO3 type. These amplifiers have very small crossover distortion and are capable of providing 200 ma. peak current before excessive distortion begins. This is more than adequate, for assuming an output voltage of 7 V peak and an input impedance for each resolver of 400 ohms, the resulting peak current is 70 ma. Amplifier 21 includes a field effect transistor and has a fixed gain of $1 + 100$ K/54.9 K = 2.822. The gain of amplifier 19 is variable and depends on the value of the variable resistance of the field effect transistor which can be the 2N4858 type. A field effect transistor connected in this configuration provides a variable but very linear resistance over a fairly large range of gate and drain voltages. The gain of amplifier 21 is determined by the amplitude feedback loop w.th the field effect transistor, and will result in the amplitude of channel A excitation output being equal to channel B excitation output.

Amplitude detectors 23 and 25 each consist of a capacitor and a diode connected in a clamping type configuration. The purpose of detectors 23 and 25 is to maintain equality between the two excitation outputs. A pair of matched amplitude detectors is therefore required and this is insured by using one of a matched pair of diodes in each detector. The detector output in each of the channels is compared to a common 6.2 V reference from source 27, and the difference integrated in integrators 29 and 31 to provide a feedback signal for amplitude control. These integrators can be well known analog integrators using standard resistors, capacitors, and integrated circuit operational amplifiers. In the case of channel B the feedback control signal is applied to the final gate (not shown) of logic circuitry 13. This control in turn will effect the amplitude of both output excitations. The output voltage level of logic circuit 13 controls the voltage amplitude of channels A and B. The amplitude control input to logic circuit 13 is applied to the power supply input of the final gate and the output voltage of logic circuit 13 is therefore directly related to the amplitude control signal. In the case of channel A, feedback signals are applied to the variable resistance field effect transistor in the feedback of amplifier 19, thus forcing the output of channel A to equal the output of channel B. Control is thereby exercised over both the absolute magnitude of the excitation output and of the matching characteristics of these two outputs. Amplitude sensing feedback and control are employed on both outputs A and B. With matched amplitude detectors (AC to DC converters) and a common DC reference for comparison in integrators 29 and 31, the A and B outputs should be closely matched.

Figure 4:
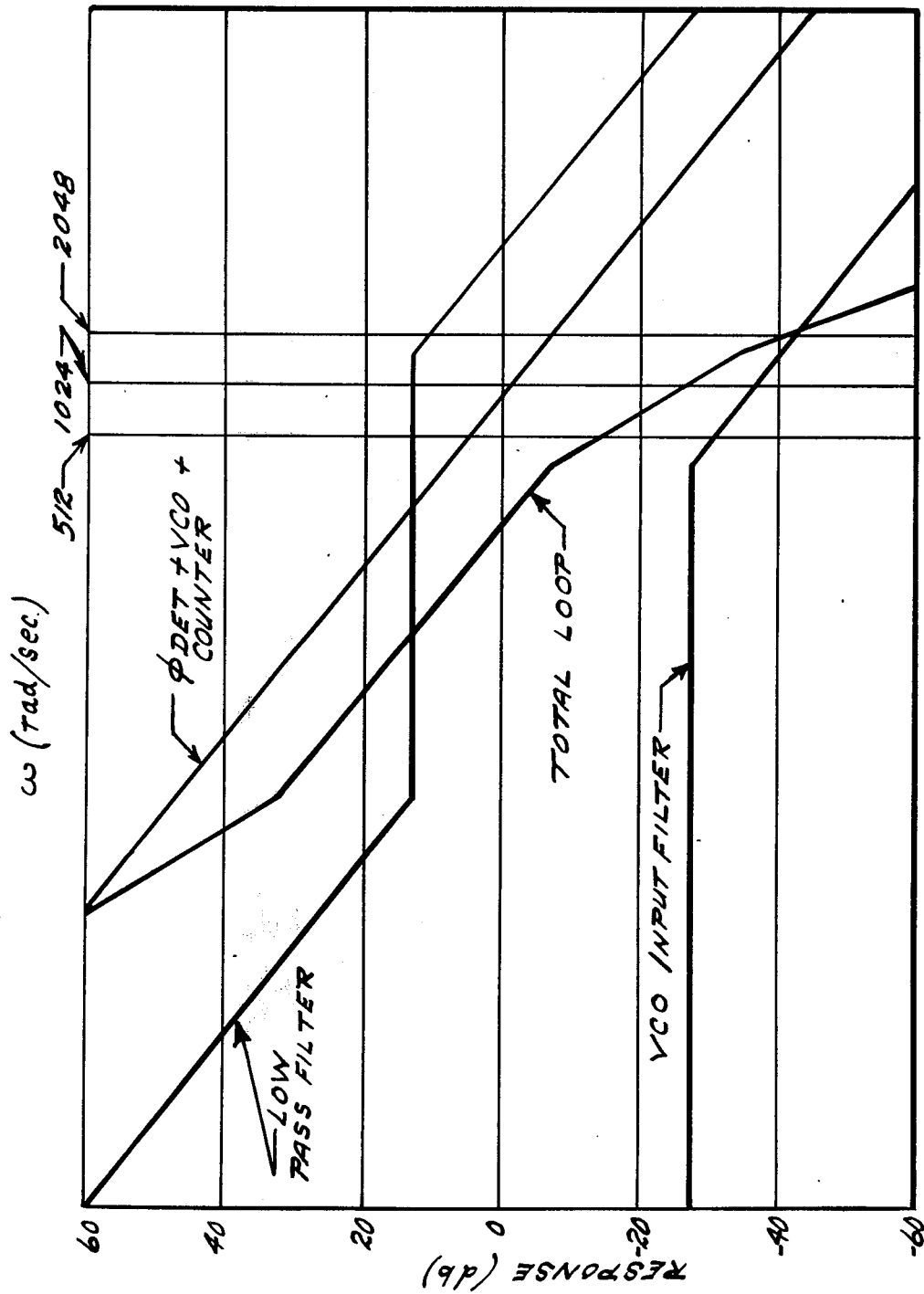
FIG. 4 is a graph showing the digital phase-locked loop open loop frequency response.

The overall frequency response of both channel A and channel B are shown in FIG. 3. The circuit schematic for the resolver excitation electronics is shown in FIG. 4. The performance of the excitation electronics is tabulated below where the first harmonic is in volts RMS and the remaining in percent.

| DISTORTION FROM EXCITATION ELECTRONICS | | |
|---|---|---|
| Harmonic | Channel A | Channel B |
| 1 | 4.969 | 4.972 |
| 2 | .029 | .014 |
| 3 | .01 | <.009 |
| 4 | <.009 | <.009 |
| 5 | <.009 | <.009 |
| 6 | <.009 | <.009 |
| 7 | <.009 | <.009 |
| 8 | <.009 | <.009 |
| 9 | <.009 | <.009 |

The distortion introduced by the resolver is insignificant - much less than .01 percent at any harmonic.

CH A = <2 mv pp, CH B −2 to 4 mv pp

A block diagram of the measurement electronics is shown in FIG. 1*b*. Differential comparators 43 and 45 are used to convert the zero crossings of outputs of resolver 41 to digital edges. In the case of the compensation windings, terminals $C_1$ and $C_2$, the differences in the zero crossing for channel A and channel B are taken in comparator 47 and generate the digital edges of the transfer strobe.

After converting the resolver output to digital form, the phase detection and summing functions performed in completely digital form by phase detectors 49 and 51 and summer 53. The resulting output error signals are constant amplitude pulsewidth modulated signals which are then fed to analog low pass filter 55.

Low pass filter 55 is a flexible element used to determine the eventual phase-lock loop frequency response. Frequency responses of the various stages in the phase-lock loop are shown in FIG. 4. The overall loop response is highly overdamped second order which provides zero steady state tracking error for constant angular rate inputs.

Low pass filter 55 feeds voltage controlled oscillator input filter 57 and reduces the ripple in the error signal and also sets the desired bias level for voltage controlled oscillator 59. The response of this oscillator is also shown in FIG. 4.

Voltage controlled oscillator 57 can be the C4024 type supplied by Motorola which, with 12 pf feedback capacitor, is designed to operate at a nominal frequency of 17 MHz. The power supply configuration for voltage controlled oscillator 59 with a 5 V Zener diode, provides very effective rejection of power supply variations, thus reducing output jitter due to fluctuations in the power supply voltages.

The output of voltage controlled oscillator 59 is fed to a synchronous digital counter 61. Two of the counter output signals are used as references for the digital phase detectors 49 and 51. At the proper point in time, the transfer strobe transfers the contents of the synchronous counter into the serial output register 63 where it can subsequently be shifted out at a much slower rate. This transferred count is a direct measure of the resolver angle. The input excitation voltage to the resolver primary is shifted in phase before producing the resolver magnetic field. This phase shift is caused by the primary resistance and inductance. This phase shift is large (20° to 30°) and sensitive to temperature, since the resistance of the copper wire is temperature sensitive.

The compensation windings, which are wound in the same slots as the primary, stator windings, share the same magnetic field with the stator and with the output, rotor windings. There is essentially no phase shift in the compensation or rotor winding output voltages. The phase angle between the rotor and compensation output is a direct measure of the resolver angle.

What is claimed is:
1. A resolver to digital converter comprising:
   a. a counter for frequency dividing an input signal;
   b. logic means for generating a predetermined rectangular waveform;
   c. a phase splitter fed by the logic means and having a pair of otrhogonal outputs;
   d. a pair of operational amplifiers fed by the orthogonal outputs of the phase splitter;
   e. first and second matched amplitude detectors, each fed by one of the pair of operational amplifiers;
   f. first and second integrating comparators fed one each by the first and second matched amplitude detectors and fed back respectively to the first and second operational amplifiers;
   g. a resolver including compensation windings fed by each of the operational amplifiers;
   h. first and second zero crossing differential comparators fed by the orthogonal outputs of the resolver;
   i. first and second phase detectors fed by first and second zero crossing differential comparators;
   j. a summer fed by the first and second phase detectors producing error signals;
   k. a voltage controlled oscillator fed by the summer;
   l. a synchronous digital counter fed by the voltage controlled oscillator and fed back to the first and second phase detectors for reference signals forming a second order phase locked loop;
   m. a serial output register fed by the synchronous digital counter; and
   n. a third zero crossing differential comparator interposed between the compensation windings of the resolver and the serial output register for a strobe pulse whereby the count in said synchronous digital counter when strobed is a digital representation of the analog input.

* * * * *